(12) United States Patent
Lim et al.

(10) Patent No.: US 9,633,874 B1
(45) Date of Patent: Apr. 25, 2017

(54) PACKAGE SUBSTRATE WARPAGE RESHAPING APPARATUS AND METHOD

(71) Applicant: Altera Corporation, San Jose, CA (US)

(72) Inventors: Chew Ching Lim, Sungai Petani (MY); Ken Beng Lim, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/334,528

(22) Filed: Jul. 17, 2014

(51) Int. Cl.
*H01L 21/64* (2006.01)
*H01L 21/67* (2006.01)

(52) U.S. Cl.
CPC ........ *H01L 21/64* (2013.01); *H01L 21/67092* (2013.01)

(58) Field of Classification Search
None
See application file for complete search history.

(56) References Cited

U.S. PATENT DOCUMENTS

| | | | |
|---|---|---|---|
| 5,657,975 A * | 8/1997 | Szapucki | H01L 21/68728 269/157 |
| 6,194,247 B1 | 2/2001 | Burns et al. | |
| 8,217,514 B2 | 7/2012 | Pendse | |
| 8,421,197 B2 | 4/2013 | Do et al. | |
| 8,455,991 B2 | 6/2013 | Hsiao et al. | |
| 8,703,535 B2 | 4/2014 | Kim et al. | |
| 8,723,310 B2 | 5/2014 | Park et al. | |
| 2004/0195606 A1 * | 10/2004 | Basceri | C23C 14/50 257/296 |
| 2007/0287264 A1 * | 12/2007 | Rogers | H01L 21/187 438/457 |
| 2009/0305612 A1 * | 12/2009 | Miyazaki | B24B 37/345 451/11 |
| 2014/0242729 A1 * | 8/2014 | Mannen | H05K 1/0271 438/4 |

* cited by examiner

*Primary Examiner* — Charles Garber
*Assistant Examiner* — Steven Christopher
(74) *Attorney, Agent, or Firm* — Michael H. Lyons (57) ABSTRACT

A warpage reshaping apparatus to reshape a warpage profile of a package substrate is disclosed. The warpage reshaping apparatus includes a metal boat, a plurality of planar boards and a plurality of spring-loaded clips. The metal boat includes a plurality of cavities. Package substrates are placed into each of the cavities. Each of the plurality of planar boards is disposed on a respective one of the package substrates. The spring-loaded clips have a first portion coupled to the metal boat and having a second portion biased against a respective one of the planar boards such that each planar board is biased against its respective package substrate. In addition to that, a method to operate the warpage reshaping apparatus is also disclosed and the manner in which the warpage reshaping apparatus changes the warpage profile of the package substrate is also disclosed.

20 Claims, 7 Drawing Sheets

PACKAGE SUBSTRATE WARPAGE RESHAPING APPARATUS AND METHOD

BACKGROUND

A flip-chip integrated circuit package generally includes an integrated circuit die mounted on top of a package substrate using available backend assembly processes. Prior to assembly, the substrate may be warped. This warpage may be categorized by a variety of warpage profiles. The warpage is a result of the baking step in the package assembly manufacturing process. The warpage profiles may be classified into different groups that include a 'crying' (convex) warpage profile, a 'smiling' (concave) warpage profile, a 'potato-chip' (wavy) warpage profile and a 'flat' warpage profile.

Among all the pre-assembled package substrates, almost 7-11% of pre-assembled package substrates may have a severe 'crying' warpage profile (i.e., warpage level of approximately 50-100 microns (μm)), which are often rejected. Package substrates with a severe 'crying' warpage profile are rejected because such package substrates generally have reliability concerns and, in some cases, may adversely affect the functional performances of the resulting integrated circuit packages. Such rejection may usually cost a lot to the integrated circuit package manufacturer and this may eventually increase the cost of manufacturing integrated circuit packages.

SUMMARY

Embodiments described herein include a warpage reshaping apparatus for a package substrate and methods of operating the apparatus. It should be appreciated that the embodiments can be implemented in numerous ways, such as a process, an apparatus, a system, a device, or a method. Several embodiments are described below.

In one embodiment, a method of reshaping a warpage profile of a package substrate is disclosed. The method includes a step to place the package substrate into a cavity that is formed within a reshaping apparatus. In addition to that, the method includes a step to apply mechanical forces to a predefined area of the package substrate. Furthermore, the method also includes a step to heat the package substrate at a reflow temperature.

In another embodiment, a method of operating a warpage reshaping apparatus is disclosed. The method includes a step to place a package substrate into a cavity of the warpage reshaping apparatus. Furthermore, the method also includes a step to place a planar surface above the package substrate. In one embodiment, the planar surface may include blocks that extend in a perpendicular direction from a bottom surface of the planar surface towards a top surface of the package substrate. Finally, the method also includes a step to apply mechanical forces on a top surface of the planar surface.

In one embodiment, an apparatus to reshape a warpage profile of a package substrate is disclosed. The apparatus includes a metal boat, a plurality of package substrates, a plurality of planar boards and a plurality of spring-loaded clips. The metal boat includes a plurality of cavities. Each package substrate is placed into a respective cavity formed within the metal boat. Each of the plurality of planar boards is disposed on a respective one of the package substrates. The spring-loaded clips have a first portion coupled to the metal boat and having a second portion biased against a respective one of the planar boards such that each planar board is biased against its respective package substrate.

Further features of the invention, its nature and various advantages will be more apparent from the accompanying drawings and the following detailed description of the preferred embodiments.

DETAILED DESCRIPTION

The following embodiments describe a warpage reshaping apparatus for a package substrate and methods of operating the apparatus. It will be obvious, to one skilled in the art, that the present exemplary embodiments may be practiced without some or all of these specific details. In other instances, well-known operations have not been described in detail in order not to unnecessarily obscure the present embodiments.

Figure 1:
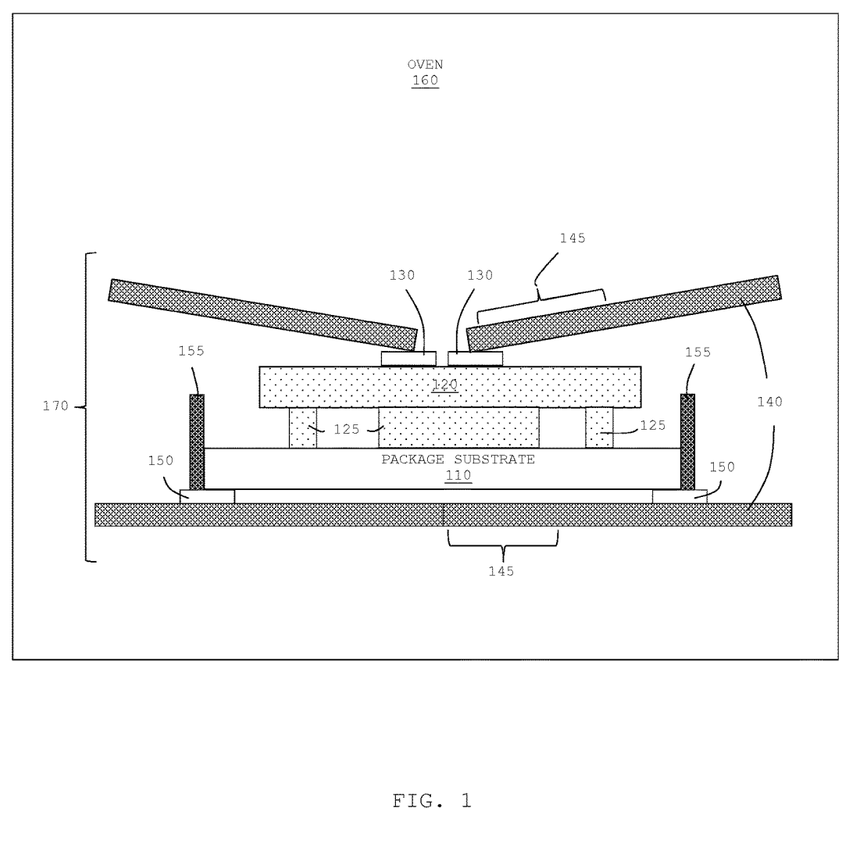
FIG. 1 shows an illustrative warpage reshaping apparatus that clamps a package substrate and is placed in a reflow oven in accordance with one embodiment of the present invention.

FIG. 1, meant to be illustrative and not limiting, illustrates a warpage reshaping apparatus that clamps a package substrate and is placed in a reflow oven in accordance with one embodiment of the present invention. Warpage reshaping apparatus 170 includes metal boat 150, support pins 155, planar board 120 that has blocks 125 extended in a perpendicular direction from a bottom surface, and clips 140. In the embodiment of FIG. 1, warpage reshaping apparatus 170 may include two clips 140. Warpage reshaping apparatus 170 may house package substrate 110 within a cavity that is available on metal boat 150. As shown in the embodiment of FIG. 1, the cavity is formed between support pins 155. Warpage reshaping apparatus 170 may be utilized for reshaping the warpage profile of package substrate 110. To further facilitate the warpage profile reshaping of package substrate 110, package substrate 110 and warpage reshaping apparatus 170 may be placed inside oven 160 (e.g., reflow oven or baking oven). In one embodiment, warpage reshaping apparatus 170 may operate similar to a 'jig-clamp.'

It should be appreciated that package substrate 110 may be an essential part of an integrated circuit package. As an example, package substrate 110 may act as a base to support an integrated circuit die within the integrated circuit package. Additionally, package substrate 110 may include signal traces (not shown) so that signals can be routed between an integrated circuit die and external circuits (i.e., external to the integrated circuit package). Therefore, package substrate 110 may include multiple routing layers, dielectric layers and through-hole vias (all not shown in FIG. 1) to route signals through package substrate 110. In one exemplary embodiment, package substrate 110 that forms part of a complex integrated circuit package may have at least ten substrate layers.

Package substrate 110, as part of the integrated circuit package, may form part of a circuit system (e.g., a communication system). In one embodiment, package substrate 110 may form a part of a programmable logic device (PLD), for example, a field programmable gate array (FPGA) device package. Alternatively, package substrate 110 may form a part of an application specific integrated circuit (ASIC) device package or application specific standard products (ASSP) device package, such as, a memory device package or a microprocessor device package.

There are various means of coupling between an integrated circuit die and package substrate 110 within the integrated circuit package. In one embodiment, the coupling between the integrated circuit die and package substrate 110 may be in the form of flip-chip interconnects or wire bond interconnects. If the package substrate 110 does not have a proper warpage profile, the various couplings and routings performed by the substrate may be compromised and the resultant assembled integrated circuit package may be defective.

Prior to reshaping in warpage reshaping apparatus 170, package substrate 110 may have a variety of warpage profiles. In one embodiment, the warpage profile of package substrate 110 may be categorized into: a 'crying' warpage profile, a 'smiling' warpage profile, a 'potato-chip' warpage profile or a 'flat' warpage profile. It should be noted that a 'crying' warpage profile may describe a package substrate with a negative, or convex curvature, where edges of the package substrate bend downward from the center of the package substrate. Conversely, a 'smiling' warpage profile refers to a package substrate with a positive, or concave, curvature, where edges of the package substrate bend upward from the center of the package substrate. Accordingly, a package substrate with a 'potato-chip' warpage profile may have warped or deformed edges while a package substrate with a 'flat' warpage profile may be have substantially planar surfaces.

It should be appreciated that the variety of warpage profiles for a package substrate such as package substrate 110 may be a consequential result of a baking step during the manufacturing of the package substrate. It should be noted that the baking step may be an essential step to manufacture a package substrate. As stated above, each package substrate 110 is formed using multiple dielectric layers glued together. The dielectric layers may be glued by dispensing adhesive materials between every two dielectric layers. However, the dispensing process is generally not a precise process. Hence, different amounts of adhesive material may be dispensed between every two dielectric layer. Therefore, when the adhesive material dries during the baking step, the dielectric layers may have different expansion rates as a result of different amounts of adhesive material dispensed between the layers. The different expansion rates may subsequently cause warpage in the resulting package substrate.

The effects of warpage on package substrate 110 may be worse when package substrate 110 has a large dimension. In one embodiment, package substrate 110 may be considered large when its dimensions are greater than 35 millimeter (mm) and 35 mm, respectively (i.e., 35 mm×35 mm package substrate 110). A highly complex package substrate 110 may generally have dimensions that are larger than 35 mm×35 mm (e.g., 40 mm×40 mm or, in some instances, 50 mm×50 mm).

In one embodiment, a top surface of package substrate 110 may further include contact pads. The contact pads are utilized to receive the integrated circuit bumps of an integrated circuit die. Commonly, the contact pads on package substrate 110 are located in a middle region of package substrate 110 and are arranged in an array formation.

As described above, metal boat 150 may have one or more cavities. The dimensions of each cavity on metal boat 150 may depend on the type of package substrate that it houses. For example, the dimensions of a cavity may be 35 mm×35 mm when the dimensions of package substrate 110 are at maximum of 35 mm×35 mm. Similarly, the cavity may be 40 mm×40 mm or 50 mm×50 mm when the dimensions of package substrate 110 are at maximum of 40 mm×40 mm or 50 mm×50 mm, respectively. It should be appreciated that package substrate 110 of other dimensions may require metal boat 150 that is custom made with appropriate cavity size.

Metal boat 150 may also include support pins 155 surrounding the cavity. Support pins 155 may be utilized to fix package substrate 110 to a single location. Once package substrate 110 is placed within the cavity, package substrate 110 may not be able to move relative to the warpage reshaping apparatus 170, even when warpage reshaping apparatus 170 is moved. As shown in the embodiment of FIG. 1, support pins 155 extend perpendicular from the top surface of metal boat 150. In one embodiment, the height of support pins 155 may be similar to or greater than the thickness of package substrate 110.

Still referring to FIG. 1, planar board 120 includes multiple blocks 125 that are placed directly adjacent to the top surface of package substrate 110. In one embodiment, the dimensions of planar board 120 may be similar to the dimensions of package substrate 110. For example, the dimensions of planar board 120 may be greater than 35 mm×35 mm. In an alternative embodiment, the dimensions of planar board 120 may be smaller than the dimensions of packages substrate 110 but larger than a region that covers the array of contact pads on package substrate 110.

Blocks 125, which extend from planar board 120 down towards the top surface of package substrate 110, may be utilized to transfer mechanical force that is applied to planar board 120 to specific areas on package substrate 110. In one embodiment, blocks 125 may be located in such manner as to warp package substrate 110 from a warpage profile (e.g., a 'crying' warpage profile) to a different warpage profile (e.g., a 'smiling' warpage profile). In addition to that, blocks 125 may be located in such manner as to avoid coupling with any contact pads of package substrate 110. For example, blocks 125 may be coupled to the middle portion of package substrate 110, however not the contact pads of package substrate 110.

Clip structures 140 may be utilized to press the top surface of planar board 120 and a bottom surface of metal boat 150. Clip structures 140 may be placed in temporary physical contact with the top surface of planar board 120 through coin block structures 130. As shown in FIG. 1, one clip structure 140 is coupled on the right side (relative to FIG. 1) and the other clip structure 140 is coupled on the left side (also relative to FIG. 1) of planar board 120 and metal boat 150. Clip structures 140 may provide a mechanical force onto the top surface of planar board 120, thereby pressing planar board 120 down onto package substrate 110. In one embodiment, each clip structure 140 includes two jaw-ends 145. One jaw-end 145 is coupled to the top surface of planar board 120 and another jaw-end 145 is coupled to the bottom surface of metal boat 150. In the embodiment of FIG. 1, jaw-ends 145 are coupled to the top surface of planar board 120 through coin block structures 130. Coin block structure 130 may be a solid block structure in shape of a coin. Coin block structures 130 may distribute the pressure received directly from jaw-ends 145 of clip structures 140 to a larger surface area.

In one embodiment, placing the package substrate 110 into warpage reshaping apparatus 170 may be sufficient to achieve a desired warpage profile on package substrate 110. The amount of mechanical force exerted by clips 140 and the time the package substrate 110 remains in the warpage reshaping apparatus 170 will in part dictate the resultant warpage profile achieved. In another embodiment, placing the warpage reshaping apparatus 170 and package substrate 110 in oven 160 may further aid in achieving the desired warpage profile.

Generally, a reflow oven as oven 160 may be used for melting solder materials of solder balls on a package substrate so that an electronic component can be mounted to a surface of a printed circuit board (PCB). However, in the embodiment of FIG. 1, oven 160 is utilized to provide heat so that package substrate 110 may become moldable, and with the mechanical forces provided by warpage reshaping apparatus 170 to package substrate 110, the warpage portfolio of package substrate 110 may be changed. In one embodiment, oven 160 may be set to a temperature that enables warping of package substrate 110.

Figure 2A:
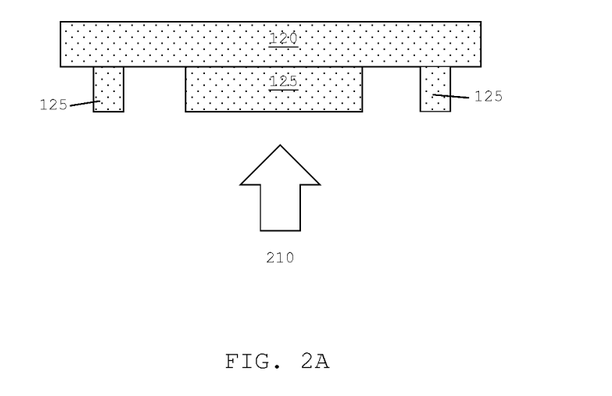
FIGS. 2A and 2B show a respective side-view and bottom-view of the planar board of FIG. 1 in accordance with one embodiment of the present invention.

FIG. 2A, meant to be illustrative and not limiting, illustrates a side-view of planar board 120 in accordance with one embodiment of the present invention. Planar board 120 may be similar to planar board 120 of FIG. 1. Hence, as described in FIG. 1, planar board 120 also include blocks 125 that extends in perpendicular direction from the bottom surface of planar board 120. Bottom view 210 of planar board 120 is shown in FIG. 2B.

Figure 2B:
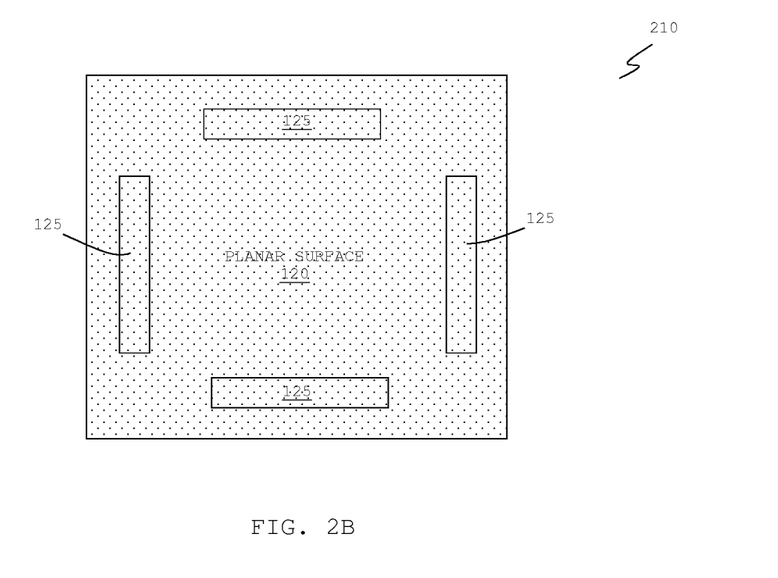

FIG. 2B, meant to be illustrative and not limiting, illustrates bottom view 210 of planar board 120 in accordance with one embodiment of the present invention. As shown in the embodiment of FIG. 2B, planar board 120 is shaped in a rectangular shape (and, naturally therefore, has four edges). Furthermore, bottom view 210 shows the locations of each block 125 at a respective edge of planar board 120.

It should be appreciated that the number of blocks 125 may vary depending on how much applied force is to be distributed across the package substrate (e.g., package substrate 110 of FIG. 1). For example, increasing the number of blocks 125 may reduce the amount of force each block 125 exerts on package substrate 110. Conversely, decreasing the number of blocks 125 may increase the amount of force each block 125 exerts on package substrate 110.

In addition to that, the locations of blocks 125 may be selected based on to what extent the type of warpage profile that the package substrate is to be reshaped into. For example, when the package substrate is to be reshaped into a moderately 'smiling' warpage profile, planar board 120 may have blocks 125 that are located near the mid-region of planar board 120. Alternatively, when the package substrate is to be reshaped into a severe 'smiling' warpage profile, planar board 120 may have blocks 125 that are located in the middle of planar board 120. When the package substrate is to be reshaped into a moderately 'crying' warpage profile, planar board 120 may have blocks 125 that are located near the mid-region of planar board 120, however with package substrate being flipped before being placed in a metal boat.

Furthermore, the locations of blocks 125 may also depend on the locations of contact pads on the package substrate. Generally, the contact pads are arranged in an array formation on a top surface of the package substrate. In order not to damage the contact pads, blocks 125 may be located on an outer region of planar board 120 so that contact is made at the outer region of package substrate and not where the contact pads are located.

Figure 3:
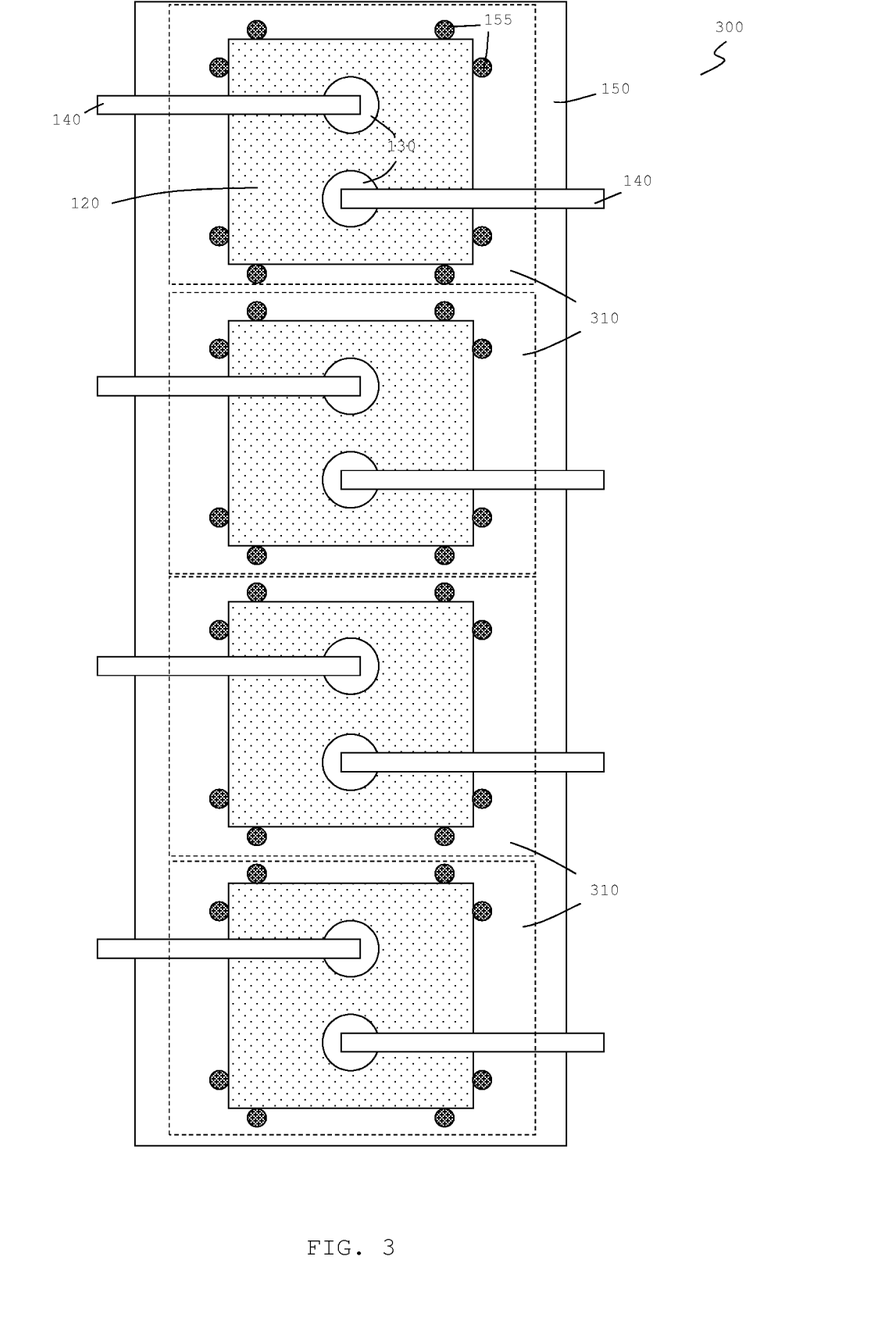
FIG. 3 shows a top view of a warpage reshaping apparatus that is capable of reshaping four package substrates in accordance with one embodiment of the present invention.

FIG. 3, meant to be illustrative and not limiting, illustrates a top view of a reshaping apparatus that is capable of reshaping four package substrates in accordance with one embodiment of the present invention. Warpage reshaping apparatus 300 may be similar to warpage reshaping apparatus 170 of FIG. 1. In one embodiment, the four package substrates that may be reshaped by warpage reshaping apparatus 300 may be similar to package substrate 110 of FIG. 1. As shown in the embodiment of FIG. 3, warpage reshaping apparatus 300, and in particular metal boat 150, includes four designated areas 310 to reshape four separate package substrates. In one embodiment, warpage reshaping apparatus 300 may be designed to include more than four designated areas 310.

Each designated area 310 includes two clip structures 140, two coin block structures 130, planar board 120 and multiple support pins 155. Clip structures 140, coin block structures 130, planar board 120 and support pins 155 may be similar to the respective clip structures 140, coin block structures 130, planar board 120 and support pins 155 described in FIG. 1.

Four separate package substrates may be placed within different designated area 310. The package substrate may be identical type or different type. Each package substrate is placed within a cavity that is formed between support pins 155. Subsequently, different planar boards 120 are mounted on top of different package substrates. In one embodiment, planar boards 120 may have identical arrangement of blocks (i.e., blocks 125 of FIG. 1) to obtain identical final warpage profile. Alternatively, planar boards 120 may have different arrangement of blocks to obtain different types of final warpage profile. Next, mechanical force is applied to each planar board 120 using a respective clip structure 140.

Figure 4:
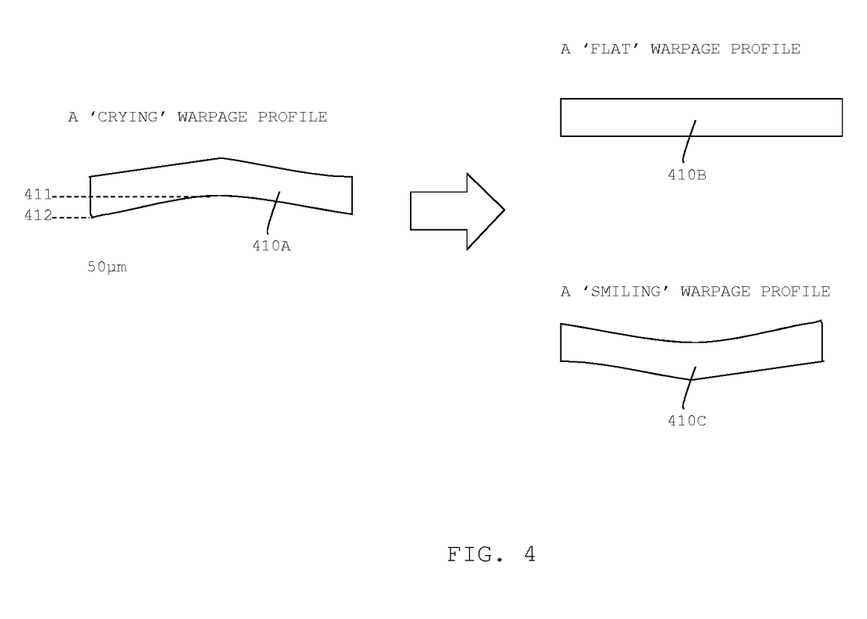
FIG. 4 shows a package substrate that has a 'crying' warpage profile reshaped into a 'flat' warpage profile or a 'smiling' warpage profile.

FIG. 4, meant to be illustrative and not limiting, illustrates a package substrate that has a 'crying' warpage profile reshaped into a 'flat' warpage profile or a 'smiling' warpage profile. As shown in the embodiment of FIG. 4, the 'crying' warpage profile package substrate 410A may have a warpage value of 50 microns (μm). It should be appreciated that the warpage value is measured by taking two points on one surface of the package substrate with the highest vertical distance. Therefore, in the embodiment of FIG. 4, the warpage value may be measured between lines 411 and 412.

As shown in the embodiment of FIG. 4, 'flat' warpage profile package substrate 410B and 'smiling' warpage profile package substrate 410C may be two different outcomes after 'crying' warpage profile package substrate 410A is placed in a reshaping apparatus (e.g., warpage reshaping apparatus 170 of FIG. 1 or warpage reshaping apparatus 360 of FIG. 3).

Figure 5:
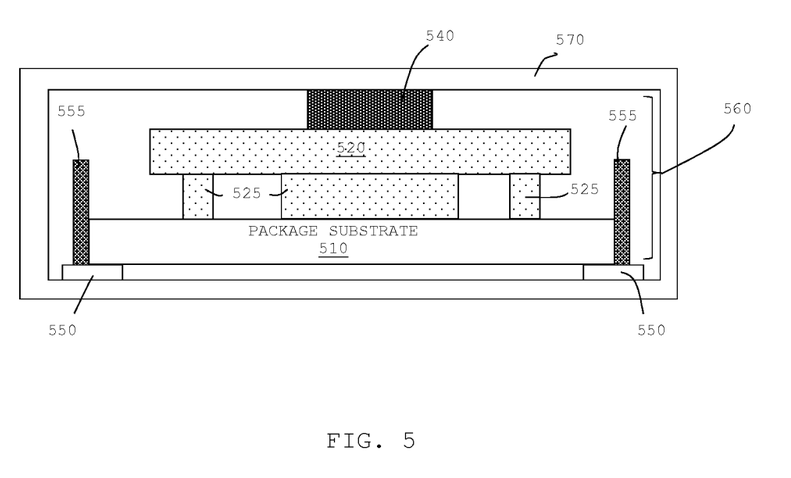
FIG. 5 shows an illustrative warpage reshaping apparatus that is formed within a magazine chamber in accordance with one embodiment of the present invention.

FIG. 5, meant to be illustrative and not limiting, illustrates a warpage reshaping apparatus that is formed within a magazine chamber in accordance with one embodiment of the present invention. Warpage reshaping apparatus 560 includes package substrate 510, planar board 520, multiple blocks 525, metal boat 550 and support pins 555. In one embodiment, package substrate 510, planar board 520, blocks 525, metal boat 550 and support pins 555 may be similar to the respective package substrate 110, planar board 120, blocks 125, metal boat 150 and support pins 155 of FIG. 1. Warpage reshaping apparatus 560 may receive mechanical force through spring 540, which is placed on top of planar board 520. It should be appreciated that spring 540 may for a part of magazine chamber 570. In one embodiment, spring 540 may be a high-force spring (e.g., Hooke's constant of greater than 5 Newton per meter (N/m)) that is capable of providing a large mechanical force. When a mechanical force is applied to spring 540, the mechanical force may be transmitted to specific locations on package substrate 520 through planar board 520 and blocks 525. Warpage reshaping apparatus 560 utilizes spring 540 instead of a clip structure (e.g., clip structure 140 of FIG. 1) because magazine chamber 570 has limited space. One of ordinary skill in the art will recognize that other structures capable of providing the desired mechanical force to planar board 520 may also be used.

Referring still to FIG. 5, magazine chamber 570 is generally utilized when package substrate 510 are at a package assembly manufacturing plant. Magazine chamber 570, together with package substrate 510, may be placed into a pre-bake oven at a temperature sufficiently high so that warpage profile reshaping may occur.

Figure 6:
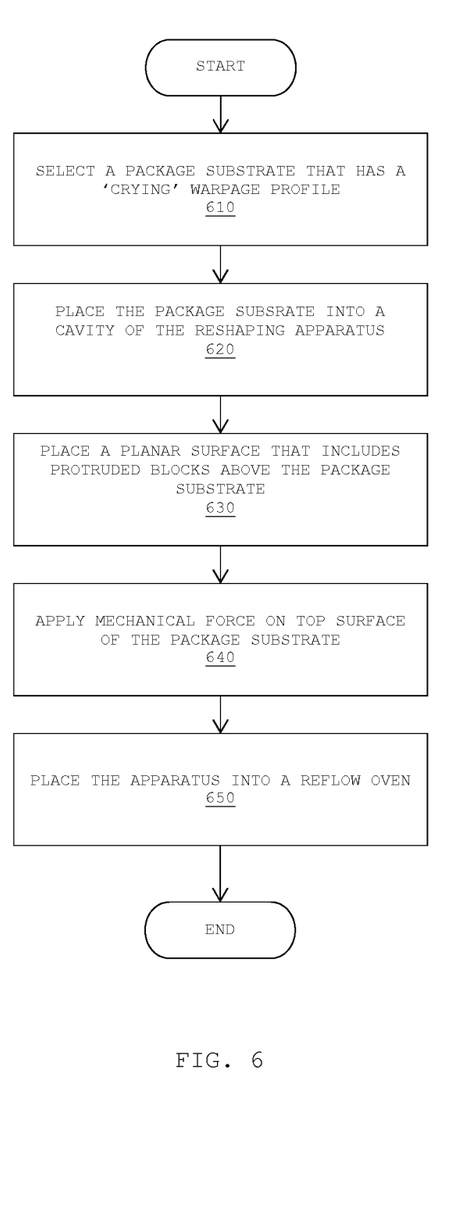
FIG. 6 is a flowchart of steps in an illustrative method for operating a warpage reshaping apparatus in accordance with one embodiment of the present invention.

FIG. 6, meant to be illustrative and not limiting, is a flowchart of a method of operating a reshaping apparatus in accordance with one embodiment of the present invention. The reshaping apparatus may be similar to warpage reshaping apparatus 170 of FIG. 1 or warpage reshaping apparatus 300 of FIG. 3. At step 610, a package substrate that has a 'crying' warpage profile is selected. In one embodiment, the package substrate may be similar to package substrate 110 or 310 of FIG. 1 or 3, respectively. The 'crying' warpage profile package substrate, as described in FIG. 1, may have a mid-portion that is higher than its edges. In one embodiment, a warpage level of the 'crying' profile package substrate may be greater than 50 microns. In one embodiment, it may not be necessary to alter a package substrate's warpage profile. If a package substrate already has a 'flat', 'smiling', or sufficiently small 'crying' warpage profile, it may not be necessary to reshape the package substrate.

At step 620, the package substrate is placed into a cavity formed within the reshaping apparatus. In one embodiment, the cavity may be similar to the cavity on metal boat 150 of FIG. 1. The cavity may be large enough to fit the package substrate. In addition to that, the cavity may be surrounded by support pins (e.g., support pins 155 of FIG. 1). The support pins may retain the package substrate in one position so that there are no unwanted movements within the cavity when the reshaping apparatus is moved.

At step 630, a planar board with protruding blocks is placed on top of the package substrate. In one embodiment, the planar board and blocks may be similar to planar board 120 and blocks 125 of FIG. 1. The blocks on the planar board may be placed in such a manner so that when the blocks contact the package substrate, the blocks may not contact the solder landing pads on the package substrate. Therefore, as shown in FIG. 2B, the blocks may be located on edges of the planar board.

At step 640, mechanical forces are applied to a top surface of package substrate. In one embodiment, the mechanical forces are applied through clip structures (e.g., clip structure 145 of FIG. 1), where jaw-ends of the clip structures place a desired amount of force on the top surface of the package substrate. Alternatively, when the package substrate is still at the package assembly manufacturing plant, mechanical forces may be applied to the top surface of the package substrate through a spring (e.g., spring 540 of FIG. 5).

At step 650, the reshaping apparatus is placed into an oven. In one embodiment, the oven may be similar to oven 160 of FIG. 1. When the temperature within the reflow oven reaches approximately 260 degrees Celsius, the package substrate may become moldable and the warpage profile of the package substrate may be changed. Alternatively, if the reshaping apparatus is placed within a magazine chamber, the entire magazine chamber is placed into a baking oven where the temperature may be approximately 150 degrees Celsius.

After step 650, the package substrate may have its profile altered from the 'crying' warpage profile (e.g., 'crying' warpage profile package substrate 410A of FIG. 4) to a 'flat' warpage profile (e.g., 'flat' warpage profile package substrate 410B of FIG. 4) or a 'smiling' warpage profile package substrate (e.g., ' smiling' warpage profile package substrate 410C of FIG. 4).

Figure 7:
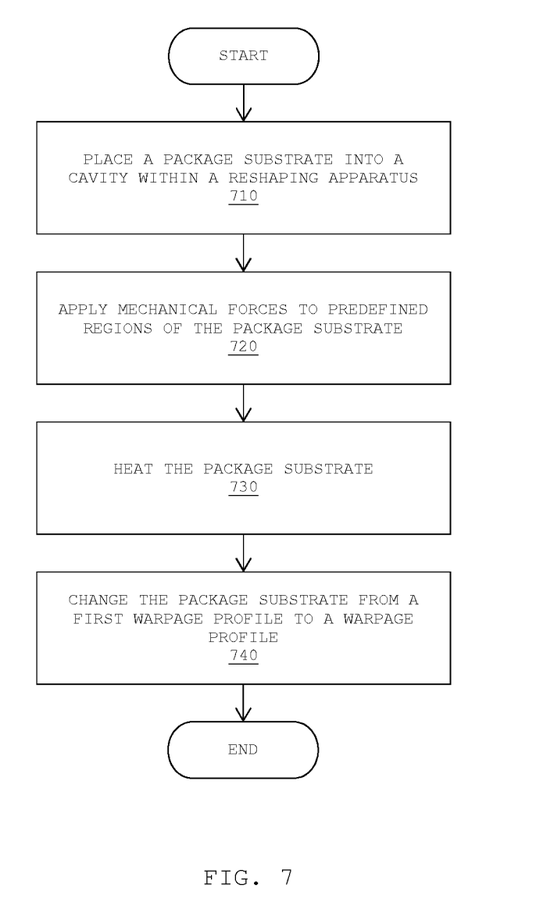
FIG. 7 is a flowchart of steps in an illustrative method for changing a warpage profile of a package substrate in accordance with one embodiment of the present invention.

FIG. 7, meant to be illustrative and not limiting, is a flowchart of a method of changing the warpage profile of a package substrate in accordance with one embodiment of the present invention. The package substrate may be similar to package substrate 410A of FIG. 4. At step 710, a package substrate is placed into a warpage reshaping apparatus. The package substrate is placed inside a cavity of the warpage reshaping apparatus. In one embodiment, the warpage reshaping apparatus may be similar to warpage reshaping apparatus 170 of FIG. 1, warpage reshaping apparatus 300 of FIG. 3 or warpage reshaping apparatus 560 of FIG. 5.

At step 720, mechanical forces are applied to predefined regions of the package substrate. The predefined regions of the package substrate may be an area that is outside the pre-solder region on the package substrate. In one embodiment, the mechanical forces are applied to a moderately mid-region of the package substrate. In order to apply mechanical forces to this region of the package substrate, a planar board with protruding blocks at its proper location may be needed (e.g., blocks 125 formed on planar board 120 as shown in the embodiment of FIG. 2B). Alternatively, the mechanical forces may be applied to the center of the package substrate. To apply the mechanical forces to the center of the package substrate, the planar board may have blocks formed at its center region.

At step 730, the package substrate is heated. In one embodiment, the package substrate is heated to temperature that enables warping of the package substrate inside a reflow oven (e.g., oven 160 of FIG. 1 or oven as described in FIG. 5). The heat may enable the package substrate to alter its warping profile.

At step 740, the package substrate changes from a first warpage profile to a second warpage profile. The change may occur after the package substrate is heated. In one embodiment, the first warpage profile may be a 'crying' warpage profile, a 'potato-chip' warpage profile, a 'flat' warpage profile or a 'smiling' warpage profile. The second warpage profile, which is the warpage profile after undergoing the reshaping using the warpage reshaping apparatus, may be a 'smiling' warpage profile.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of reshaping a warpage profile of a package substrate using a reshaping apparatus having a plurality of pins, the method comprising:
   placing the package substrate into a cavity formed within the reshaping apparatus, wherein the plurality of pins surrounds edges of the package substrate when the package substrate is placed into the cavity;
   attaching a spring to a magazine chamber that encloses the plurality of pins;
   using the spring to apply mechanical forces to a predefined region of the package substrate; and
   heating the package substrate to a temperature sufficient to reshape the warpage profile of the package substrate.

2. The method as defined in claim 1, wherein the predefined region is a region on the package substrate that is external to a pre-solder region of the package substrate.

3. The method as defined in claim 1 further comprising:
   changing the package substrate from a first warpage profile to a second warpage profile, wherein the first warpage profile is different from the second warpage profile.

4. The method as defined in claim 3, wherein the first warpage profile is selected from the group of warpage profiles consisting of: a crying warpage profile, a wavy warpage profile, a flat warpage profile, and a smiling warpage profile.

5. The method as defined in claim 1, wherein the package substrate is reshaped to have a smiling warpage profile.

6. The method defined in claim 1, wherein using the spring to apply the mechanical forces to the predefined region of the package substrate comprises:
   applying the mechanical forces through a planar board placed below the spring; and
   applying the mechanical forces through a block structure place below the planar board.

7. A method of operating a warpage reshaping apparatus, comprising:
   placing a package substrate into a cavity of the warpage reshaping apparatus;
   mounting a planar board above the package substrate, wherein the planar board includes blocks extending in a perpendicular direction from a bottom surface of the planar board towards a top surface of the package substrate; and
   applying, using a spring-loaded clip structure, a mechanical force on a top surface of the planar board, wherein a portion of the spring-loaded clip structure overlaps the package substrate, wherein the spring-loaded structure is oriented at a non-parallel angle with respect to the top surface of the planar board while the spring-loaded clip structure is applying the mechanical force to the top surface of the planar board, and wherein the mechanical force reshapes a warpage profile of the package substrate.

8. The method as defined in claim 7, further comprising:
   placing the warpage reshaping apparatus into an oven that generates a temperature sufficient to reshape the warpage profile of the package substrate.

9. The method as defined in claim 7, further comprising:
   fixing the package substrate into place within the cavity using support pins located on edges of the cavity.

10. The method as defined in claim 7, further comprising:
    identifying package substrates that do not satisfy a warpage level limit; and
    reshaping only the package substrates that do not satisfy the warpage level limit.

11. The method as defined in claim 7, wherein a distance between a lowest point and a highest point on a given surface of the package substrate is greater than 50 microns prior to placing the package substrate into the cavity.

12. The method defined in claim 7, further comprising:
    clipping the planar board and the package substrate together using an additional clip structure, wherein the additional clip structure provides the mechanical force to the top surface of the planar board, wherein the spring-loaded clip structure extends around a first edge of the package substrate and the additional clip structure extends around a second edge of the package substrate that opposes the first edge, and wherein the clipping structure is offset with respect to the additional clipping structure.

13. The method defined in claim 7, wherein applying, using the spring-loaded clip structure, the mechanical force on the top surface of the planar board comprises:
    interposing a block structure between the spring-loaded clip structure and the planar board, wherein the block structure is operable to distribute pressure from the spring-loaded clip structure onto the top surface of the planar board, and wherein the spring-loaded clip structure directly contacts the block structure.

14. The method defined in claim 7, wherein the spring-loaded structure is oriented at a non-perpendicular angle with respect to the top surface of the planar board while the spring-loaded clip structure is applying the mechanical force to the top surface of the planar board.

15. Apparatus, comprising:
    a metal boat having a cavity that receives a package substrate;
    a planar board disposed over the cavity;
    a clip having a first portion coupled to the metal boat and having a second portion biased against the planar board such that the planar board is pressed towards the cavity, wherein the planar board comprises four blocks, each of which is coupled to a different respective edge of the planar board; and
    a block structure interposed between the clip and the planar board that is operable to distribute pressure from the clip onto a surface of the planar board, wherein the block structure directly contacts the clip and the planar board.

16. The apparatus as defined in claim 15, wherein the cavity has length and width dimensions that are each greater than 35 millimeters.

17. The apparatus as defined in claim 15, further comprising:
   a plurality of pins, each of which is located at a different corner edge of the cavity, wherein the pins are arranged around edges of the package substrate to retain the package substrate within the cavity.

18. The apparatus as defined in claim 15, further comprising:
   an additional cavity that receives an additional package substrate;
   an additional planar board disposed over the additional cavity; and
   an additional clip having a first portion coupled to the metal boat and having a second portion biased against the additional planar board such that the additional planar board is pressed towards the additional cavity.

19. The apparatus as defined in claim 15, wherein the metal boat comprises four cavities that house four package substrates.

20. The apparatus defined in claim 15, further comprising:
   a first pin structure formed along a first edge of the package substrate;
   a second pin structure formed along a second edge of the package substrate, wherein the first and second pin structures are formed adjacent to a first corner of the package substrate;
   a third pin structure formed along a third edge of the package substrate that opposes the second edge;
   a fourth pin structure formed along a fourth edge of the package substrate that opposes the first edge, wherein the third and fourth pin structures are formed adjacent to a second corner of the package substrate that opposes the first corner of the package substrate, and wherein the first, second, third, and fourth pin structures laterally fix the package substrate into place within the cavity.

* * * * *